United States Patent [19]
Waldron et al.

[11] 4,000,418
[45] Dec. 28, 1976

[54] APPARATUS FOR STORING AND RETRIEVING ANALOG AND DIGITAL SIGNALS

[75] Inventors: Wesley K. Waldron, Scotia; Charles W. Eichelberger, Schenectady, both of N.Y.

[73] Assignee: General Electric Company, Schenectady, N.Y.

[22] Filed: Nov. 26, 1975

[21] Appl. No.: 635,702

[52] U.S. Cl. .............................. 250/211 J; 307/304; 357/24; 357/32
[51] Int. Cl.[2] ........................................ H01J 39/12
[58] Field of Search ............ 250/211 R, 211 J, 578; 307/304; 357/24, 30, 32; 340/166 R

[56] References Cited
UNITED STATES PATENTS

| | | | |
|---|---|---|---|
| 3,898,685 | 8/1975 | Engeler et al. | 307/304 |
| 3,900,883 | 8/1975 | Hasegawa et al. | 357/32 |

*Primary Examiner*—David C. Nelms
*Attorney, Agent, or Firm*—Julius J. Zaskalicky; Joseph T. Cohen; Jerome C. Squillaro

[57] ABSTRACT

An array of charge storage devices each including a pair of closely coupled conductor-insulator-semiconductor cells, one a row line connected cell and the other a column line connected cell, is provided on a common semiconductor substrate. The potential well associated with the row connected cell is deeper than the potential well associated with the column connected cell. Read out of charge stored in a row of devices is accomplished by lowering the absolute potential of the row line to a first level to cause the charges stored in the row connected cells to be transferred to column connected cells of the row. The voltage on each of the column lines is then lowered in absolute magnitude in sequence to a second level to cause the charges to be transferred from the column connected cells to the row connected cells. The charge induced on the row line during transfer of charge from the column connected cells to the row connected cells is sensed to provide non-destructive readout of the stored charges.

14 Claims, 33 Drawing Figures

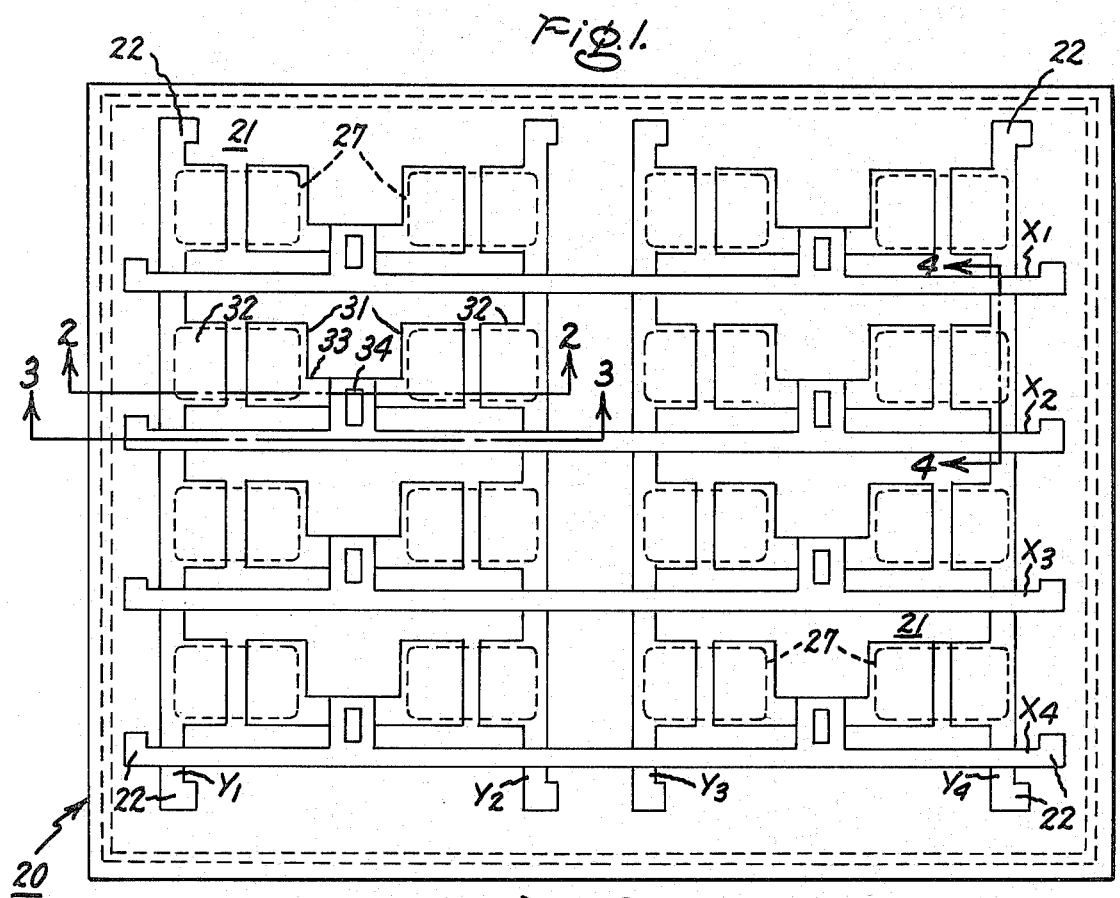
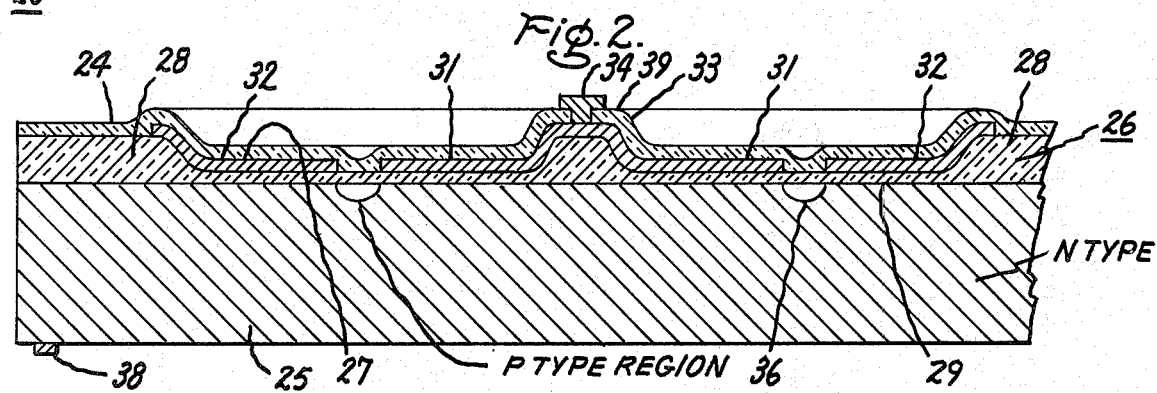
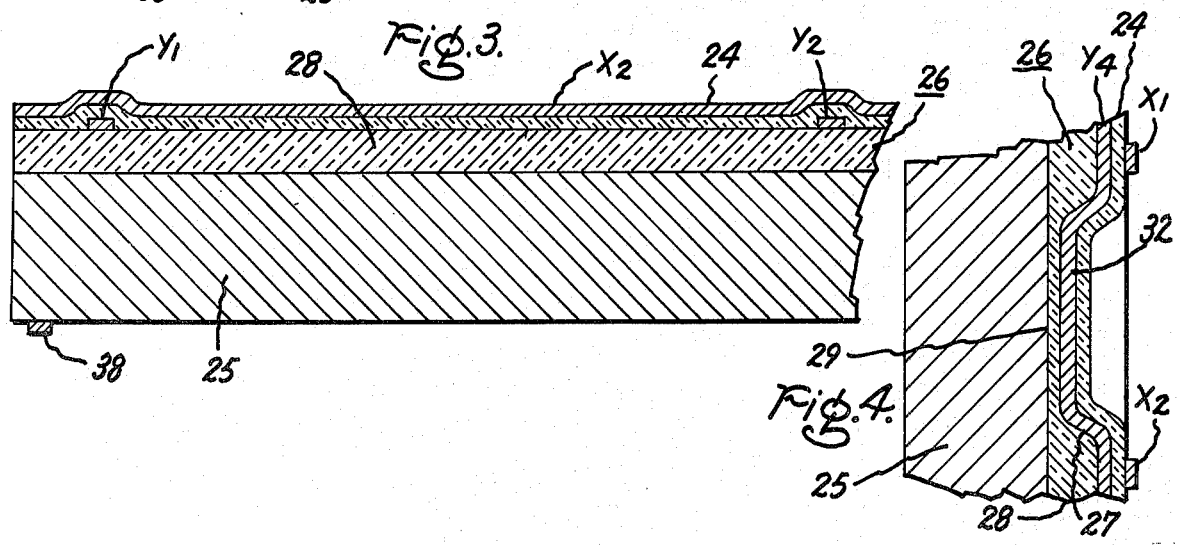

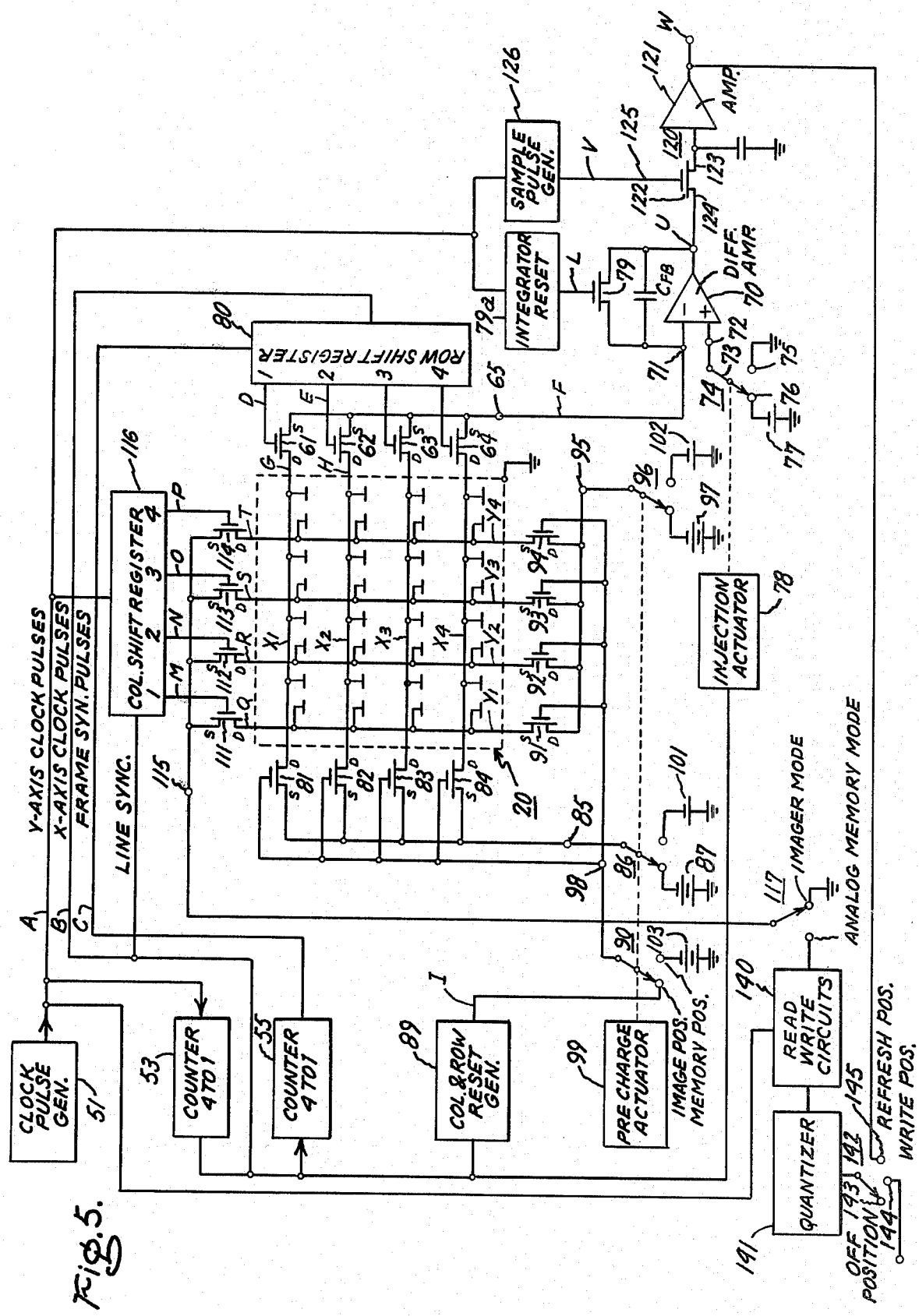

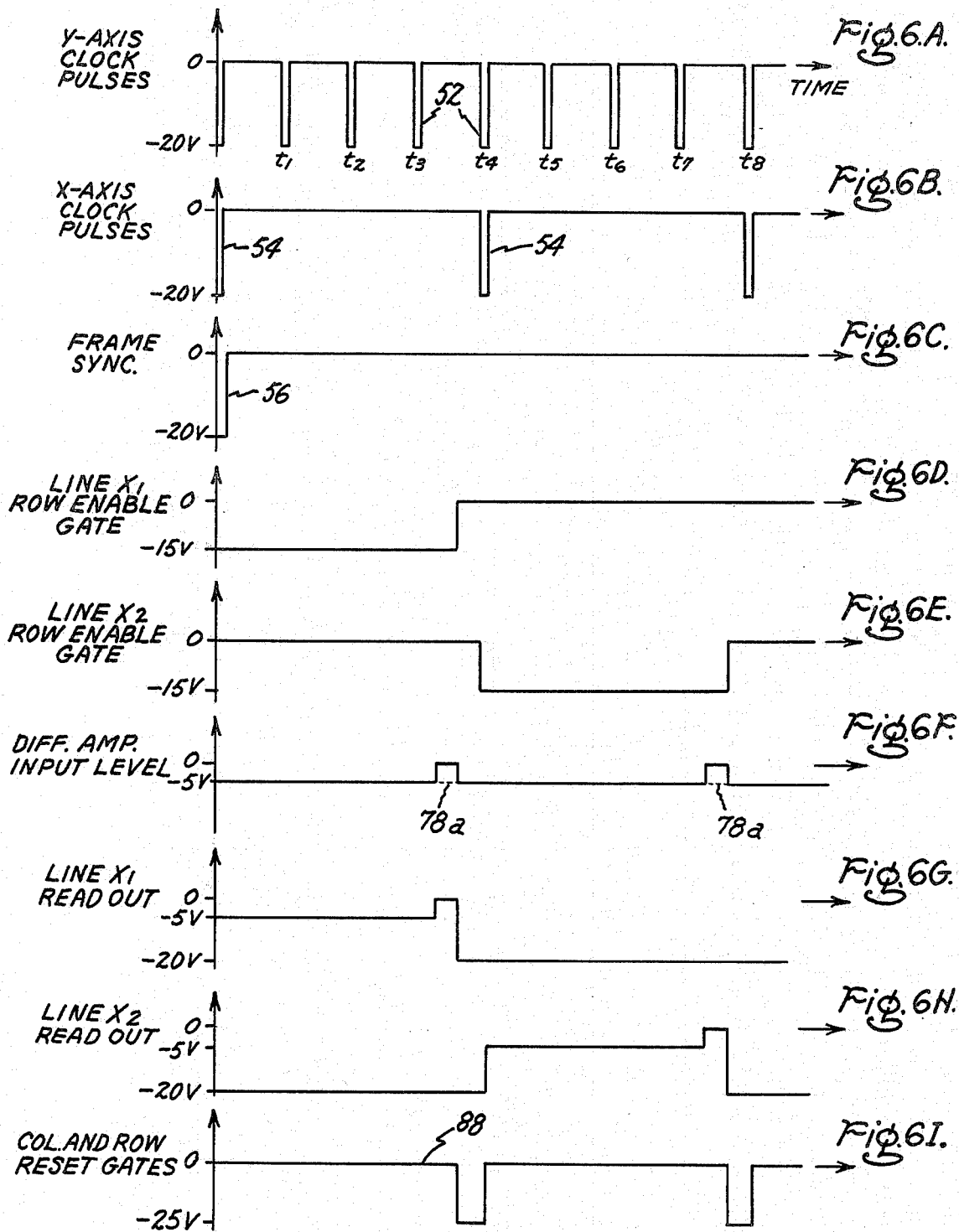

4,000,418

APPARATUS FOR STORING AND RETRIEVING ANALOG AND DIGITAL SIGNALS

The present invention relates in general to apparatus including devices and circuits therefor for storing and retrieving analog and digital signals, and in particular to such apparatus wherein the information is stored in the form localized charges in a semiconductor substrate.

This application relates to improvements in the apparatus of U.S. Pat. No. 3,805,062 and patent application Ser. No. 554,155, filed Feb. 28, 1975, both of which are assigned to the assignee of the present application and both of which are incorporated herein be reference thereto.

An object of the present invention is to provide improvements in apparatus including an array of charge storage devices on a common semiconductor substrate for storage and retrieval of analog and digital signals which may be initially obtained either in the form of a pattern of radiation or in the form of electrical signals.

Another ojbect of the present invention is to provide simple apparatus including an array of charge storage devices on a common semiconductor substrate for non-destructive read out of localized charges representing analog and digital signals.

A further object of the present invention is to provide apparatus including an array of charge storage devices on a common semiconductor substrate for read out of localized charges representing analog signals which is relatively insensitive to variations in the geometric organization of the devices of the array.

In carrying out the invention in one illustrative embodiment thereof there is provided a substrate of semiconductor material of one conductivity type having a major surface. A plurality of first conductive plates are provided, each overlying and in insulated relationship to the major surface and forming a first conductor-insulator-semiconductor capacitor with the substrate. A plurality of second conductive plates are provided, each adjacent a respective first conductive plate to form a plurality of pairs of plates, the pairs of plates being arranged in a matrix of rows and columns, each of the second conductive plates overlying and in insulated relationship to the major surface and forming a second conductor-insulator-semiconductor capacitor with the substrate. Each second conductor-insulator-semiconductor capacitor is coupled to a respective first conductor-insulator-semiconductor capacitor so as to permit the transfer of stored charge between them. A plurality of row conductor lines are provided, the first conductive plates in each of the rows are connected to a respective row conductor line. A plurality of column conductor lines are provided, the second conductive plates in each of the columns are connected to a respective column conductor line.

A first voltage means provides a first voltage between the row conductor lines and the substrate to deplete respective first portions of the substrate lying thereunder of majority charge carriers and provides an absolute potential of a first value therein. A second voltage means provides a second voltage between the column conductor lines and the substrate to deplete respective second portions of the substrate lying thereunder of majority charge carriers and provides an absolute potential of a second value therein. Preferably, the second value of potential is substantially less than the first value of potential. Means are provided for storing charge in the first portions of the substrate. First means are provided for reducing the first voltage on each of the row conductor lines in sequence to a first level during a respective first period of time to cause the first portions of the substrate associated with the respective row line to be reduced in absolute potential to a third value less than the second value whereby charge stored in the first portions transfers into respective second portions of the substrate associated with the respective row line. Second means are provided for reducing in sequence the second voltage on each of the column conductor lines to a second level to cause the second portions of the substrate to be reduced in potential to a fourth value less than the third value whereby charge stored in each of the second portions transfers into the first portions.

Means are provided for sensing in sequence each of the signals induced on the respective row line during the transfer of charge from the second portions to the first portions of the substrate associated with the respective row line.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 is a plan view of an array or assembly of charge storage devices incorporated in the apparatus of the present invention shown in FIG. 5.

FIG. 2 is a sectional view of the assembly of FIG. 1 taken along section lines 2—2 of FIG. 1.

FIG. 3 is a sectional view of the assembly of FIG. 1 taken along section lines 3—3 of FIG. 1.

FIG. 4 is a sectional view of the assembly of FIG. 1 taken along section lines 4-4 of FIG. 1.

FIG. 5 is a block diagram of a system capable of operating either as an image senser or as a memory in accordance with the present invention.

Figure 6J:
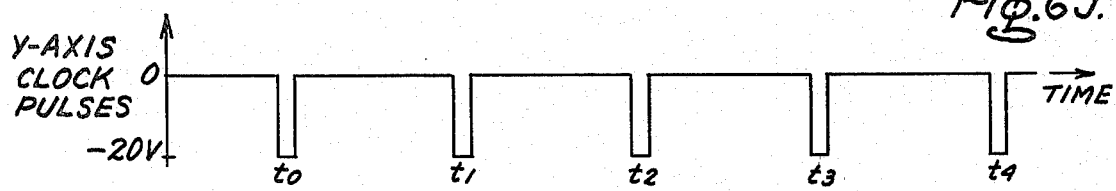
Figure 6K:
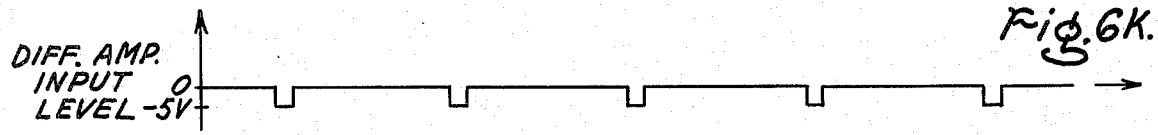
Figure 6L:
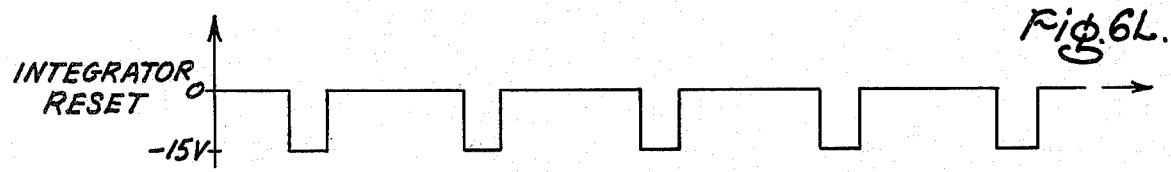
Figure 6M:
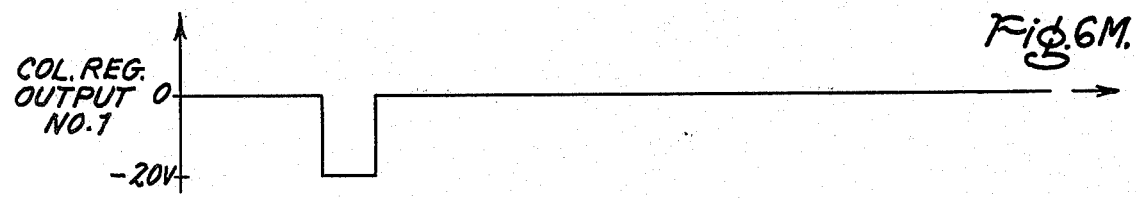
Figure 6N:
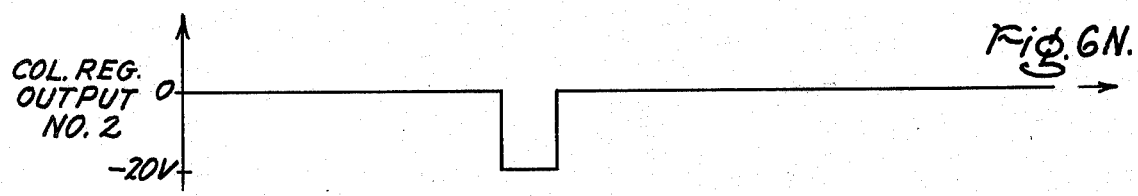
Figure 6O:
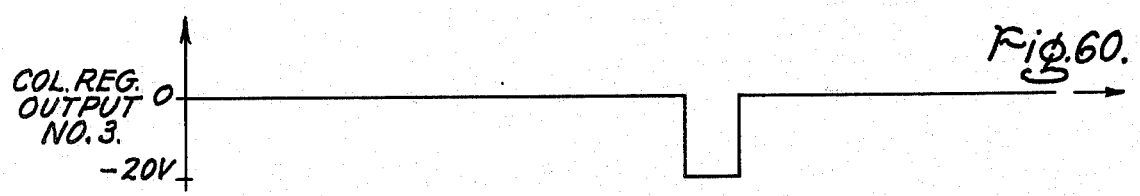
Figure 6P:
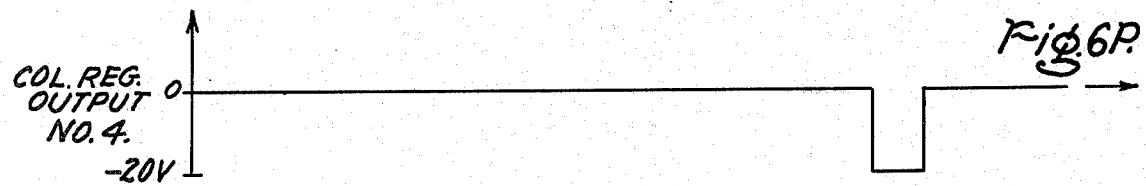
Figure 6Q:
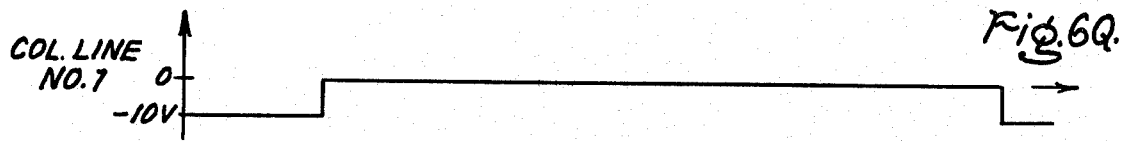
Figure 6R:
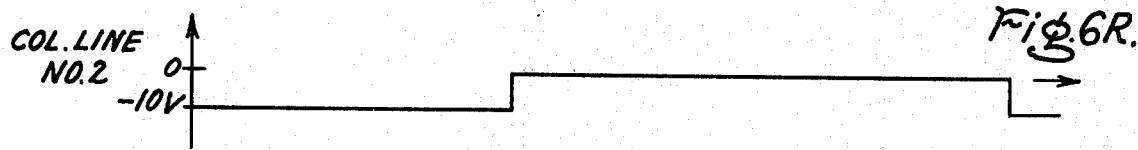
Figure 6S:
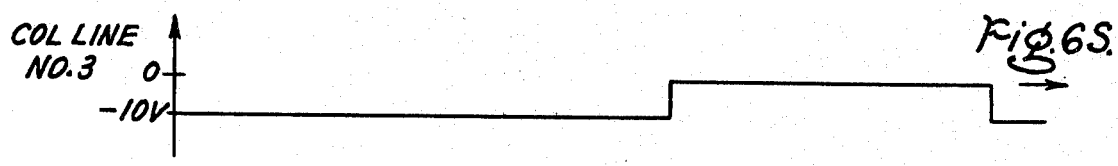
Figure 6T:
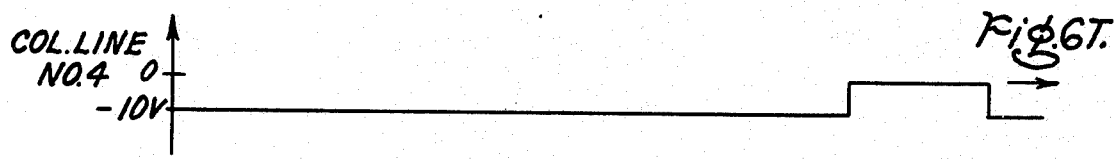
Figure 6U:
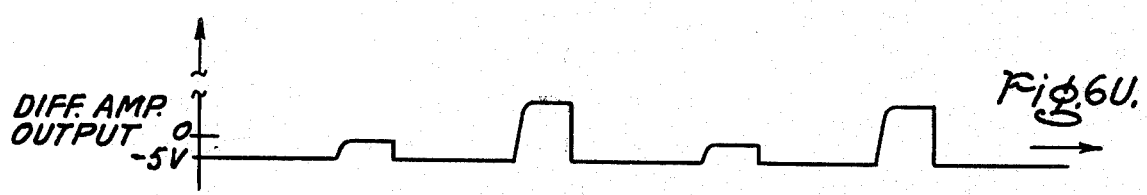
Figure 6V:
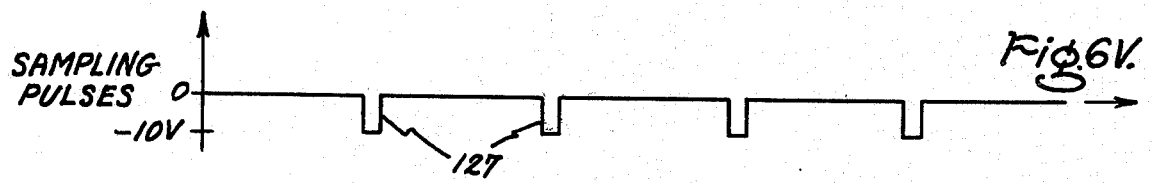
Figure 6W:
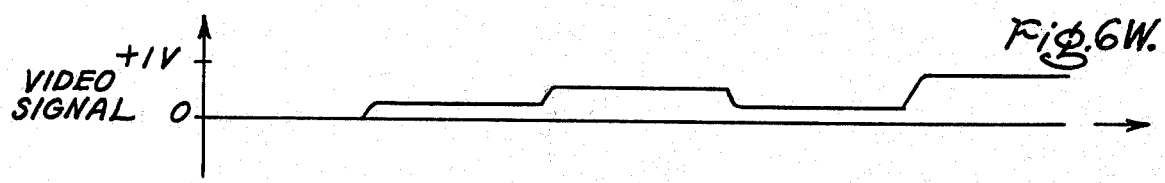

FIGS. 6A through 6W are diagrams of amplitude versus time of voltage signals occurring at various points in the system of FIG. 5. The diagrams of FIGS. 6A–6I are drawn to a common time scale and depict two lines of scan. The diagrams of FIGS. 6J–6W are drawn to another expanded common scale and depict a single line of scan. The point of occurrence of a signal of FIGS. 6A–6W in the block diagram of FIG. 5 is identified in FIG. 5 by a literal designation corresponding to the literal designation of the figure.

Figure 7:
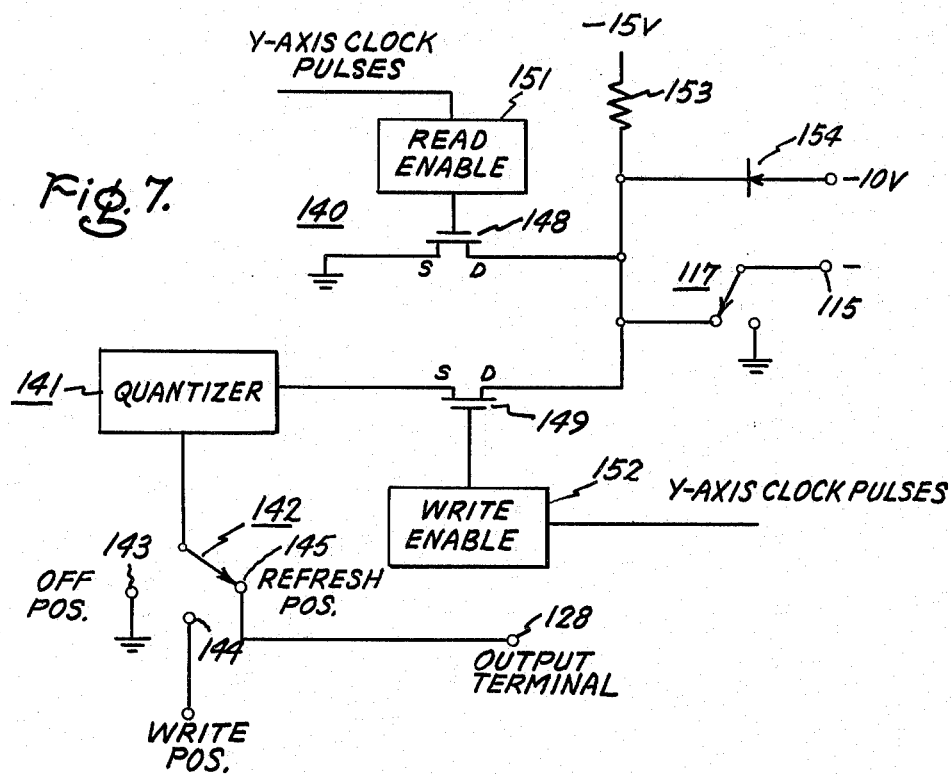

FIG. 7 is a schematic diagram of the read-write circuit of the system of FIG. 5 illustrating the manner in which the system may be used as an analog memory.

FIGS. 8A through 8D show waveform diagrams useful in explaining the operation of the circuit of FIG. 7.

Before proceeding to describe the apparatus of FIG. 5 embodying the present invention the array of charge storage and radiation sensing devices used in the apparatus will be described. While a specific form of the array fabricated using a specific technology is shown and described, it will be understood that the array utilized in the apparatus may take on other forms and that any of the commonly used technologies for charge transfer devices may be used in the fabrication thereof. Reference is now made to FIGS. 1–4 which show an array 20 of charge storage and radiation sensing devices 21, such as the device described in FIGS. 2A, 2B and 2C, of aforementioned U.S. Pat. No. 3,805,062 arranged in four rows and columns. The array includes four row conductor lines, each connecting the row-oriented plates of a respective row of devices, and are designated from top to bottom $X_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs 22 provided at each end of each of the lines. While in FIG. 1 the row conductor lines appear to cross the column conductor lines, the row conductor lines are insulated from the column lines by a layer 24 of transparent glass as is readily apparent in FIGS. 2, 3 and 4. In FIG. 1 the outline of the structure underlying the glass layer 24 is shown in solid outline for reasons of clarity.

The array includes a substrate or wafer 25 of semiconductor material of N-type conductivity over which is provided an insulating layer 26 contacting a major face of the substrate 25. A plurality of deep recesses 27 are provided in the insulating layer, each for a respective device 21. Accordingly, the insulating layer 26 is provided with thick or ridge portion 28 surrounding a plurality of thin portions 29 in the bottom of the recesses. In each of the recesses is situated a pair of substantially identical conductive plates or conductive members 31 and 32 of rectangular outline. Plate 31 is denoted a row-oriented plate and plate 32 is denoted a column oriented plate. The plates 31 and 32 of a device 21 are spaced close to one another along the direction of a row and with adjacent edges substantially parallel. In proceeding from the left hand portion of the array to the right hand portion, the row-oriented plates 31 alternate in lateral position with respect to the column oriented plates 32. Accordingly, the row-oriented plates 31 of pairs of adjacent devices of a row are adjacent and are connected together by a conductor 33 formed integral with the formation of the plates 31. With such an arrangement a single connection 34 from a row conductor line through a hole 39 in the aforementioned glass layer 24 is made to the conductor 33 connecting a pair of row-oriented plates. The column-oriented conductor lines are formed integrally with the formation of the column-oriented plates 32. The surface adjacent portion of the substrate 25 underlying the space between the plates 31 and 32 of each device 21 is provided with a P-type conductivity region 36. The glass layer 24 overlies the thick portion 28 and thin portion 29 of the insulating layer 26 and the plates 31 and 32, conductors 33 and column-oriented conductor lines $Y_1$–$Y_4$ thereof except for the contact tabs 22 thereof. The glass layer 24 may contain an acceptor activator and may be utilized in the formation of the P-type region 36. A ring shaped electrode 38 is secured to the major surface of the substrate opposite the major surface on which the devices 21 were formed and provides conductive connection to the substrate. Such a connection to the substrate permits rear face as well as front face illumination of the array.

The array 20 and the devices 21 of which they are comprised may be fabricated using a variety of materials and in variety of sizes in accordance with established techniques for fabricating integrated circuits as described in the aforementioned U.S. Pat. No. 3,805,062.

Referring now to FIG. 5 there is shown a block diagram of apparatus utilizing the charge storage array of FIG. 1 which is capable of function as both an imager and as an analog memory. The apparatus will be initially described with regard to its functioning as an imager and then will be described with regard to its functioning as an analog memory. Functioning as an imager, the apparatus provides a video signal in response to radiation imaged on the array by a lens system (not shown), for example. The video signal may be applied to a suitable display device (not shown) such as a cathode ray tube as described in the above-referenced U.S. Pat. No. 3,805,062 along with sweep voltages synchronized with the scanning of the array to convert the video signal into a visual display of the image.

The system will be described in connection with FIGS. 6A–6W which show diagrams of amplitude versus time of signals occurring at various points in the system of FIG. 5. The point of occurrence of a signal of FIGS. 6A–6W is referenced in FIG. 5 by a literal designation corresponding to the literal designation of the figure reference.

The system includes a clock pulse generator 51 which develops a series of regularly occurring Y-axis pulses 52 of short duration shown in FIG. 6A, occurring in sequence at instants of time $t_1$–$t_8$ and representing a half scanning cycle of operation of the array. The output of the clock pulse generator 51 is applied to a first counter 53 which divides the count of the clock pulse generator by four to derive X-axis clock pulses 54, such as shown in FIG. 6B. The output of the first counter 53 is also applied to a second counter 55 which further divides the count applied to it by four to provide frame synchronizing pulses 56 to the array.

The sensing array 20, which is identical to the charge storage array of FIG. 1 and is identically designated, includes row conductor lines $X_1$ thru $X_4$ and column conductor lines $Y_1$ thru $Y_4$. The drive circuits for the row conductor lines $X_1$–$X_4$ and for the column conductor lines $Y_1$–$Y_4$ of array 20 are included on the same substrate 50 as the array to minimize the number of external connections which are required to be made for connection of the array 20 into the system.

To enable selective read out of a row of devices a plurality of row-enable switches 61–64 are provided. The row-enable switches 61–64 are in the form of MOSFET transistor devices formed integrally on the substrate, each having a source electrode, a drain electrode and a gate electrode. Each of the drains of devices 61–64 is connected to one end of a respective one of the row conductor lines $X_1$–$X_4$ and each of the sources of the devices 61–64 is connected to row terminal 65. The row terminal 64 is connected to the inverting terminal 71 of a high gain differential amplifier 70, the non-inverting terminal 72 of which is connected to the pole 73 of a single pole double throw switch 74. (A change in voltage at the inverting input terminal in one direction in relation to a reference potential produces a change in voltage at the output terminal in the opposite direction in relation to the reference potential. A change in voltage at the non-inverting terminal in one direction in relation to a reference potential produces a change in voltage at the output terminal in the same direction in relation to the reference potential). One terminal 75 of the switch 74 is connected to the negative terminal of a 5 volt bias source 77, the positive terminal of which is connected to ground. The pole 73 of the switch is driven by injection actuator 78 synchronized with the Y-axis clock pulses to provide the waveform of FIG. 6F at the noninverting terminal 72 of the differential amplifier 70. When the switch 74 is set to apply a −5V bias to the noninverting terminal 72, as indicated by the dotted portion 78a of waveform of FIG. 6F, read out of charge in a row may be repeated, as will be explained below. A feedback capacitor $C_{FB}$ is connected between the output and the inverting input terminal 71 of the high gain differential amplifier 70. The feedback capacitor $C_{FB}$ is shunted by a reset switch 79 in the form of a MOSFET transistor, the gate of which is driven by the integrator reset circuit 79a synchronized with the Y-axis clock pulses of FIG. 6A. The potential of inverting terminal 71 follows the nonverting terminal 72 of the high gain differential amplifier 70. Thus, when the reset switch 79 is closed the voltage on terminal 65 is the same as on the nonverting terminal 72, i.e. the voltage waveform of FIG. 6F. The gate electrodes of the transistors 61–64 are connected to successive output terminals of the row shift register 80, numbered respectively 1, 2, 3 and 4. The outputs at terminals 1 and 2 of the row shift register are shown, respectively, in FIGS. 6D and 6E. The outputs at terminals 3 and 4 are similar to output of terminal 1 except appropriately delayed in time to occur during the third and fourth row line scan periods, respectively. The input to row shift register 80, referred to as frame sync pulse, is the pulse obtained at the output of the second counter 55. One frame sync pulse occurs for every 16 Y-axis clock pulses. Oppositely phased clock drive pulses for the row shift register 80 are derived from the X-axis clock pulses. The oppositely phased drive line pulses are applied to each of the stages of the row shift register 80 to produce the indicated outputs at the terminals 1–4 thereof. The row shift register 80 may be any of a number of shift registers known to the art. The elements of the shift register 80 may be concurrently formed on the substrate at the same time that the devices of the array 20 are formed.

To reestablish storage voltage on all of the row lines and, in particular on the row just read out, row reset switches 81–84 are provided. The reset switches 81–84 are in the form of MOSFET transistors integrally formed on the substrate 50, each having a drain electrode connected to the other end of a respective one of the row conductor lines $X_1$–$X_4$ and each having a source electrode connected to a row line biasing terminal 85, which in the operation in the system as an imager is connected through a two position switch 86 to the negative terminal of a −20 volt source 87, the positive terminal of which is connected to ground. Each of the gate electrodes of the transistors 81–84 is driven by a common drive signal 88 shown in FIG. 6I obtained from the output of column and row reset generator 89 through a two position switch 90. The inputs to the column and row reset generator 89 are the X-axis clock pulses of FIG. 6B.

To reestablish storage potential on all of the column lines after read out of a row of devices, column reset switches 91–94 are provided. The reset switches 91–94 are in the form of MOSFET transistors integrally formed on the substrate 50, each having a source electrode, a drain electrode and a gate electrode. Each of the sources of the devices 91–94 is connected to one end of a respective one of column lines $Y_1$–$Y_4$ and each of the drains is connected to column drain terminal 95 which in turn is connected through two position switch 96 to the negative terminal of −10 volt source 97, the positive terminal of which is connected to ground. Each of the gates of devices 91–94 is connected to gate terminal 98 which is connected through two position switch 90 to the column and row reset generator 89. Thus, during the occurrence of the line $X_1$ row enable gating pulse of FIG. 6D the voltage appearing on line $X_1$ is set by the voltage on terminal 65 shown in FIG. 6F. After the line $X_1$ rises to zero volts, charge is injected into the substrate and the voltage thereafter drops to −20V and remains there in response to actuation of the row reset switches 81–84 by the voltage waveform of FIG. 6I applied to switches 81–84. A similar sequence of voltage changes occurs on line $X_2$ during the occurrence of the line $X_2$ row enable gate waveform of FIG. 6E. Also, a similar sequence of voltage changes (not shown) occurs on lines $X_3$ and $X_4$.

When the apparatus of FIG. 5 is operated either as an imager or as an analog memory in the read out mode the two position switches 86, 90 and 96 controlled by precharge actuator 99 are in the position shown in the drawing. When the switches 86, 90 and 96 are set in the other position by the precharge actuator and referred to as the precharge position, −5 volt sources 101 and 102 are connected to row lines $X_1$–$X_4$ and to column lines $Q_1$–$Y_4$ by switches 86 and 96. This action is achieved by connecting the gates of devices 81–84 and 91–94 to bias source 103 through switch 90. With the switches set in the precharge position, thermally generated charge in the substrate fills the potential wells of all of the devices of the array preparatory to electrically setting the charge levels in the device in accordance with an analog signal to be electrically written in and stored in the array, as will be further explained below.

Also integrally formed on the substrate 50 are a plurality of column line drive switches in the form of MOSFET transistors 111–114. Each of the transistors 111–114 has a drain electrode connected to the other end of a respective one of column conductor lines $Y_1$–$Y_4$. The source electrodes of transistors 111–114 are connected to terminal 115. The gate electrodes of the transistors 111–114 are connected to successive output terminals of the column shift register 116, numbered respectively 1, 2, 3 and 4. The output terminals 1, 2, 3 and 4 of the column shift register are shown, respectively, in FIGS. 6M–6P. The input to column shift register, referred to as line sync, are the X-axis clock pulses obtained from the output of the first counter 53. Oppositely phased clock drive pulses for the column shift register 116 are derived from the Y-axis clock pulses. The oppositely phased drive pulses are applied to each of the stages of the column shift register to produce the indicated outputs at the terminals 1–4 thereof.

As mentioned above the selected row of devices is read out by resetting the selected row line to its read out level of voltage of −5 volts and maintaining the voltage at this level during the transfer of charge from a column cell to a row cell of the selected row for each of the devices of the selected row. Resetting the selected row is accomplished by applying the resetting pulses of FIG. 6I to the reset switch 79 which connects the output of the high gain differential amplifier to the inverting input for a short interval prior to actuation of each of the column switches 111–114. As the noninverting terminal 72 is connected to a −5 volt source 77 and as the potential of the inverting terminal 71 follows the potential of the non-inverting terminal, −5 volts appears on the selected row line. Shortly after the reset switch 79 is opened by return of gate voltage of FIG. 6L to zero, the first column line $Y_1$ is connected to ground by application of gate voltage of FIG. 6M to switch 111. The transfer of charge from the column connected cell into row connected cell causes an opposing charge to be induced in the selected row line, for example row line $X_1$, which is proportional to the transferred charge. This induced charge is in response to amplifier action in which the feedback capacitance $C_{FB}$ functions to drive the inverting terminal 71 of the amplifier to maintain zero difference in voltage between its potential and the potential on the non-inverting terminal 72 connected to the source 77. The change in output voltage appearing at the output terminal of the differential amplifier 70 is equal to the charge delivered to the row line $X_1$ divided by the feedback capacitance $C_{FB}$. Accordingly, the voltage developed across the feedback capacitor $C_{FB}$ and hence at the output terminal of the differential amplifier 70 is proportional to charge stored in the column cell and transferred to the row cell. Charge sensing in this manner is further described and claimed in copending patent application Ser. No. 591,636, filed June 30, 1975 and assigned to the assignee of the present invention. The charge stored in each of the other column cells of the selected row are similarly sensed by first resetting the selected row line by reset pulse of FIG. 6I and thereafter connecting the selected column line to ground to obtain a voltage at the output of the differential amplifier which is proportional to the stored charge. The voltages appearing on the $Y_1$–$Y_4$ lines during this sequence of operations is shown in FIGS. 6Q–6T, respectively. Note that actuation of the switches 111-114 by column register outputs shown in FIGS. 6M–6P causes the column lines $Y_1$–$Y_4$ to rise from −10V to zero and remaining at zero until reset by the column and row reset pulse of FIG. 6I. The pulses of FIG. 6I causes the column lines $Y_1$–$Y_4$ to be reset to −10V and the row lines $X_1$–$X_4$ to be reset to −20V after each row of scan. As evident from FIG. 6F prior to column and row resetting operation the charge stored in the row cells of a selected row may be either injected into the substrate by the potential of the selected row line rising to zero or it may be retained by maintaining the voltage on the row line at −5 volts as shown in dotted portion 118 of FIG. 6F. During the occurrence of row resetting pulse of FIG. 6I the selected row line is dropped to −20V and charges stored in the row cells of the selected row become stored and available for a subsequent read out.

The signals appearing at the output of the differential amplifier 70 are shown in FIG. 6U. The signals are sampled by a sample and hold circuit 120 and then applied to output amplifier 121. The sample and hold circuit 120 includes transistor 122 having a drain 123, a source 124 and a gate 125 and a capacitor $C_1$. The source to drain current flow path of the transistor 120 is connected between the output of the amplifier 70 and one terminal of capacitor $C_1$, the other terminal of which is connected to ground. The gate 125 is connected to sample pulse generator 126 which is driven by the Y-axis clock pulses and provides the train of sampling pulses 127 shown in FIG. 6V. Each of the pulses 127 are of short duration and are equally spaced along the time axis. One sampling pulse occurs for every Y-axis clock pulse. Each of the pulses 127 are phased to occur during the occurrence of a signal level at the output of amplifier 70 corresponding to the charge sensed thereby dure to the transfer of charge from a column cell to a row cell of a device in the selected row.

In the operation of the system the voltage of the row line source 87 which is shown as −20 volts, establishes the charge storage capability of the row connected or oriented cells of each of the devices of the array and the voltage of the column line source 97, which is shown as −10 volts, establishes the charge storage capability of the column connected or oriented cells of each of the devices of the array. Preferably, the storage capability of the row cell should be greater than the column connected cell of each device. This result is achieved by applying higher voltages to the row connected plates than to the column connected plates. Of course, the same result could be achieved by using a thicker layer of oxide under the column connected plate than the row connected plate and utilizing the same voltages on the column and row lines. Under the control of the clock pulse generator frame synchronizing pulses, such as shown in FIG. 6C, are applied to the row shifter register. Line interval gating pulses, two of which are shown for lines $X_1$ and $X_2$ in FIGS. 6D and 6E, respectively, are derived at the output points 1–4 of the row shift register 80 in response to line rate clocking of the row shift register by the X-axis clock pulses. The line rate pulses are utilized to gate in sequence the row enable switches 61–64 to apply in sequence the voltage appearing on terminal 65 to the row lines $X_1$–$X_4$.

With the row enable pulse applied to line $X_1$ the potential of line $X_1$ changes from the −20 volt level to the −5 volt level and causes the charge stored in the row connected cells of row $X_1$ to transfer to the column connected cells of that row. Under the control of the clock pylse generator 51, line synchronizing pulses shown in FIG. 6B are applied to the column shift register 116. Device or element gating pulses such as shown in FIGS. 6M–6P are derived, respectively, at the output points 1–4 of the column shift register 116 in response to the element rate clocking of the column shift register by the Y-axis clock pulses. The element rate pulses are utilized to gate in sequence the column line switches 111-114 connecting in sequence the column lines $Y_1$–$Y_4$ to ground through mode switch 117. Thus, the charges stored in the column cells of row $X_1$ are now transferred to the row connected cells of row $X_1$. It should be noted that the charges in all of the other devices in all of the other rows of the array are situated in the row connected cells of the devices. The gating in sequence of the column lines $Y_1$–$Y_4$ has no effect with respect to the transfer of charge in the devices of other rows. The effect of applying the gating pulses to the column line switches 111–114 on the column lines is shown in FIGS. 6Q–6T. Prior to actuation of each column line switch the integrator reset switch 79 is operated to reset the voltage at the inverting terminal 71 of the differential amplifier 70 and at terminal 65 to −5 volts. During the transfer of charge from a column cell to the adjacent row cell, a balancing charge is cause to flow in line $X_1$ which is integrated across the feedback capacitance $C_{FB}$ of the differential amplifier. A voltage is obtained at the output of the differential amplifier which is proportional to the charge flow in line $X_1$ resulting from the transfer of charge from the column cell to the row cell. Similarly, the charges stored in the third and fourth devices of the row are sensed to produce signals at the output of amplifier 70 such as shown in FIG. 6U. The level of the voltage at the output of the differential amplifier 70 is maintained at the sensed value until the occurrence of the reset pulse of FIG. 6L at which time it drops to zero. The level 131 of FIG. 6U represents a measure of charge stored in the device in response to radiation received by the device located in the first row and in the first column of the array. Similarly the levels 132 through 134 represent charge stored respectively in the second, third and fourth devices in the first row of the array. The pulses on the output of the differential amplifier 70 are sampled by the sample and hold circuit 120. The sampling pulses shown in FIG. 6V are synchronized with the Y-axis clock pulses and are timed to occur during the occurrence of the levels 131 through 134. During these intervals the transistor 122 is turned on and permits the capacitor $C_1$ to charge to the voltages corresponding to these levels. Accordingly, a video signal of the first row scanned such as shown in FIG. 6W is obtained at the output of the video amplifier 121 in which the signal shifts from one video level to another at the sampling interval rate in accordance with the voltage at the output of the differential amplifier 70 during the sampling interval.

After the devices of a row have been scanned and with the column lines now at zero volts, actuation of the injection switch 78 to switch the row line potential from −5 volts to 0 volts, causes the charges situated in the row storage sites of row $X_1$ to be injected into the substrate (destructive readout). Immediately thereafter the column and row reset gate pulse of FIG. 6I occurs and actuates the row reset gates 81–84 and the column reset gates 91–94. Thus, all of the row lines are reset to −20 volts and all of the column lines are reset to −10 volts. The array is now set up for readout of charge in the next row of the array.

Should it be desired to re-read the charges stored in row $X_1$ the injection switch 78 would not be operated to shift the voltage on the row $X_1$ line from −5 volts to zero but would maintain the row $X_1$ line at −5 volts as indicated in the dotted portion 118 on voltage waveform of FIG. 6F. Thus upon occurrence of the column and row reset gate pulse, the row line $X_1$ drops to −20 volts and the charges stored in the row sites or cells of the devices of the first row would continue to be stored in the row sites. The other rows of the array are scanned and read out in sequence in exactly the same way to provide video signal at the output of the amplifier 121.

To utilize the system of FIG. 5 as an analog memory in which signals are electrically written into the memory as well as read out, circuits are required in addition to the circuits utilized for the functioning of the apparatus of FIG. 5 as an imager. The additional circuits required are shown in block form in FIG. 5 and include the read-write circuit 140 and the quantizer 141. For the apparatus to function as an analog memory, the mode switch 117 switches terminal 115 from ground to the output of the read-write circuit 140. The input of the read-write circuit 140 is connected to the output of the quantizer 141, the input of which is connected to a three position switch 142 having an off position terminal 143, a write position terminal 144 and a refresh position terminal 145 to which the output of amplifier 121 is applied. The quantizer 141 is a circuit which provides discrete levels of output signal in accordance with a continuously varying input and functions to provide refresh levels of charge in the analog memory mode of operation of the apparatus. When the memory is continuously read out charge accumulates in the devices of the array from various extraneous causes such as radiation and leakage and alters the levels of charges stored in the devices. Utilization of the quantizer 141 in connection with the read-write circuit 140 enables the original levels of charge to be established in the array, as will be explained below.

The read-write circuits are shown in more detail in FIG. 7 to which reference is now made. The read-write circuit 140 includes a first transistor 148 and a second transistor 149. The drains of the transistors 148 and 149 are connected together and to the column line terminal 115 through mode switch 117. The source of the transistor 148 is connected to ground. When the gate of the transistor 148 is actuated by the read enable circuit 151 which is synchronized with the X-axis clock pulse, the terminal 115 is connected to ground thus enabling the array 29 to be operated in the read out mode, as explained above in connection with the operation of the apparatus of FIG. 5 an imager.

The source of the transistor 149 is connected to the output of the quantizer 141, the input of which is connected to the three position switch 142, as explained above. The gate of the transistor 149 is connected to a write-enable circuit which provides a gating pulse synchronized with the Y-axis clock pulse to effect switching action between the source and drain of the transistor to enable electrically setting charge storage levels in the devices of the array 20.

The drains of the transistors 148 and 149 are connected through a load resistance 153 to a −15 volt bias source. The drains are also connected through a diode 154 to a −10 volt source. The anode of the diode is connected to the −10 volt source and the cathode is connected to the drain. Thus the voltage on the output terminal 115 is maintained at −10 volts unless a higher voltage is superimposed on the output terminal by the transistor 148 and 149.

Figure 8A:
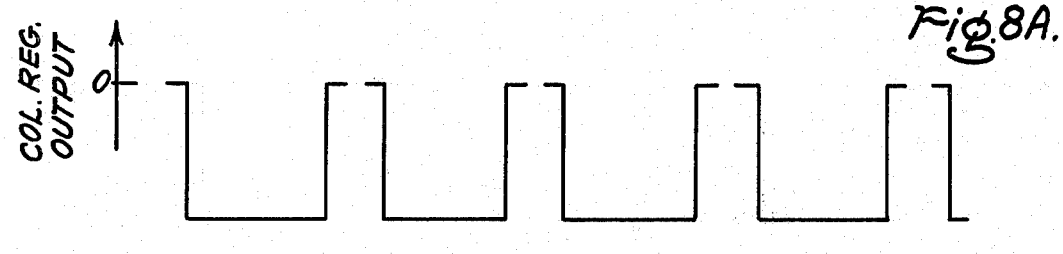
Figure 8B:
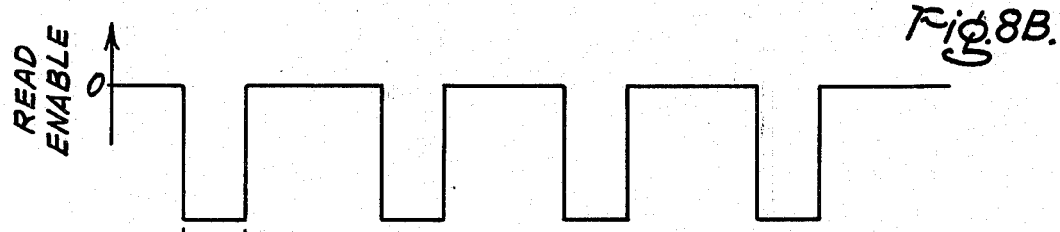
Figure 8C:
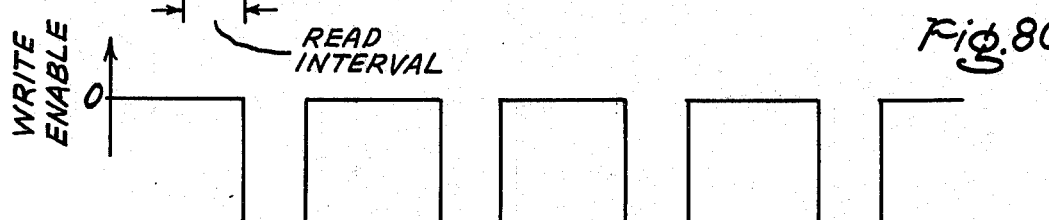
Figure 8D:
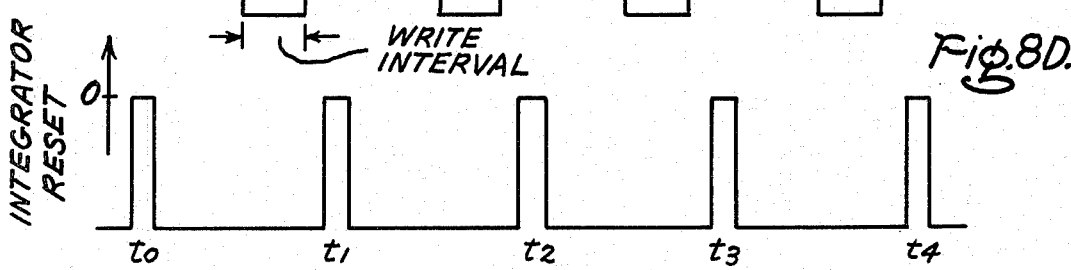

Reference is now made to FIGS. 8A–8D which show four waveforms of voltage drawn to a common time scale corresponding to the scan of a rwo of devices of the array 20 of FIG. 5. The waveform of FIG. 8A shows the sequence of occurrence of the pulses (FIGS. 6M–6P) from the output terminals 1–4 of the column shift register 116. The waveform of FIG. 8B shows the occurrence of successive read-enable pulses at the output of read-enable circuit 151 in relation to the occurrence of the column shift register output pulses. The waveform of FIG. 8C shows the occurrence of successive write-enable pulses at the output of write-enable circuit 152 in relation to the read-enable pulses of FIG. 8B and also the column shift register output pulses. The waveform of FIG. 8D shows the occurrence of the integrator reset pulses of FIG. 6L.

In the operation of the apparatus of FIG. 5 as an analog memory, the mode switch 117 is set in the analog memory mode position to connect the output of the read-write circuit 140 to column line supply terminal 115 and the precharge actuator 99 momentarily activates switches 86, 90 and 96 to connect the drains of the column reset transistors and the sources of the row reset transistors to −5 volts to allow charge thermally generated in the substrate to fill the potential wells of both the column and the row cells of the devices of the array. Thereafter the switches 86, 90 and 96 are returned to their initial position as shown and the voltage levels of −20 volts on the row lines and −10 volts on the column lines are set by the column and row reset gate waveform of FIG. 6I. The thermally generated charge is now stored in the row cells. The read-enable generator 151 is disabled and only write-enable generator 152 is allowed to operate. The switch 142 is set in the write position. During the write-enable intervals of FIG. 8C the voltage levels on the column lines are set in sequence in accordance with the quantized levels of the write signal applied to write position terminal 144. After all of the voltages are set in accordance with an analog signal, the row voltage on the row selected for storage is raised to zero by the voltage waveform of FIG. 6F to cause the charge stored in the row cells to be transferred to the column cells and to cause any excess charge to be injected into the substrate. Thereafter the row line is lowered to −20 volts and charge is transferred back to the row cells. Thus the selected row of devices has been loaded with samples of the analog signal. The other rows of devices are similarly loaded with samples of the analog signal. Read out of the analog samples is accomplished in the same manner as read out of stored charge with the apparatus operating as an imager. To this end the three position switch 142 is switches to the off position. In this position the sources of both transistors 148 and 149 are grounded and consequently on occurrence of the column pulse of FIG. 8A the column lines $Y_1$–$Y_4$ are successively raised to zero and stored charge is transferred to the row cells of the selected row to provide the read out signals as in the case of the apparatus operating in the imager mode.

If the charges representing analog samples are stored in the devices of the array for long periods of time, for example seconds, in relation to a complete cycle of read out of all of the devices of the array, minority carrier charge extraneously produced in the substrate, for example by radiation and leakage, accummulates in the devices and adds to the analog sample charge, In order to maintain the original values of the charges stored it is necessary to refresh the array. This is accomplished by removing such excess charge from the devices. The refreshing operation is performed in conjunction with read out of a device. To provide refresh the three position switch 142 is switched to the refresh position to connect the input of the quantizer 141 to output of amplifier 121. After the read out interval of a device, at which time the charge located in the column cell has been transferred to the row cell, and during the write interval, a voltage level is applied to the column line of the device corresponding to the refreshed voltage level of the device which is also the original write voltage level. This voltage is obtained from the charge sensed at that device, that is, sensed at the output of the amplifier 121 and is quantized by the quantizer 141 and applied to the column line. The quantizer 141 is a device which functions to provide successive discrete output levels corresponding to respective successive ranges of the input signal. For example, for a range of input signal from 2 to 3 volts the quantizer would provide an output of 2 volts. For a range of voltages at the input from 3 to 4 volts the quantizer 141 would provide a voltage output of 3 volts, for example. Thus, the application of voltage of reduced level to the column line reduces the amount of charge that now can be stored in the column cell connected to it. Each of the devices in a row are similarly set. At the end of a row of scan the row line is raised in potential to zero and causes charge in the row cells of the devices to be transferred to the column cells. Any excess accummulated charge now will be injected as the voltage levels on the various column lines are insufficient to hold such excess charge. After completion of the latter transfer operation the selected row line is lowered to −20 volts and the packets of charge in the various column cells of the selected row are transferred to the row cells for storage. The other rows of devices of the array are refreshed in the identical manner.

Of course, when the array 20 is operated as an analog memory, the array is shielded from ambient radiation.

In accordance with the present invention the signal sensing is associated with the row lines and the high speed switching circuits are associated with the column lines. With such a separation of circuits the effect of switching transients on signal sensing is minimized. In addition, in utilizing charge sensing with fixed voltage on the sensed row line, the effect of geometric nomuniformities in the array on signal, referred to as pattern noise, is further minimized.

While in the embodiment of FIG. 5, the column lines $Y_1$–$Y_4$ were raised to zero volts in sequence and remained at that potential during the scan of a row of devices, as shown in the waveform diagrams of FIGS. 6Q–6T, each of the column lines $Y_1$–$Y_4$ could have been lowered in potential immediately after sensing to recollect the sensed charge and thereby maintain constant impedance on the row line.

While in the exemplary embodiment of the invention the potential applied to row lines was twice the potential applied to the column lines, other ratios of potentials may be utilized provided the potential utilized for the row lines is sufficiently greater than the potential utilized for the column lines so that charge stored in a device may be stored entirely in the row connected cell of the device.

While in the exemplary embodiment injection from a row of devices is accomplished by collapsing the potential on the row line to the potential of the substrate, such a requirement is not essential. A small bias corresponding to the threshold voltage of the conductor-insulator-semiconductor storage capacitor or cell may be maintained between the row line being addressed and the substrate to maintain a bias charge in the row connected cell to avoid the adverse effects of emptying and filling the surface states of semiconductor substrate. Of course, when the voltage on a row line is collapsed to inject charge into the substrate, the voltage on the column lines should be at the same bias potential. A larger bias may be used to enhance the linear relationship between the stored charge and the applied voltages. In addition, to avoiding adverse effects such as produced by the existence of surface states in the substrate, the bias charge in the cells of the device facilitates transfer of charge between the row connected and column connected cells of a device. This mode of operation is illustrated and explained in the aforementioned U.S. Pat. No. 3,805,062 in connection with FIGS. 9A–9E thereof.

While the invention has been described in connection with an array of 16 devices, it is apparent that the invention is particularly applicable to arrays including devices many orders of magnitude greater in number than 16. Also, the devices may be organized in arrangements other than shown.

While the invention has been described in connection with an array constituted of an N-type conductivity substrate, a P-type conductivity substrate could as well be used. Of course, in such a case the applied potentials would be reverse in polarity.

While the invention has been described in specific embodiments, it will be appreciated that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. In combination,
    a substrate of semiconductor material having a major surface,
    a plurality of first conductive plates, each overlying and in insulated relationship to said major surface and forming a first conductor-insulator-semiconductor capacitor with said substrate,
    a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor,
    a plurality of row conductor lines, the first conductive plates in each of said rows connected to a respective row conductor line,
    a plurality of column conductor lines, the second conductive plates in each of said columns connected to a respective column conductor line,
    a first voltage means for providing a first voltage between said row conductor lines and said substrate to deplete respective first portions of said substrate lying thereunder of majority charge carriers and provide an absolute potential of a first value therein,
    a second voltage means for providing a second voltage between said column conductor lines and said substrate to deplete respective second portions of said substrate lying thereunder of majority charge carriers and providing an absolute potential of a second value therein,
    means for storing charge in said first portions of said substrate,
    first means for reducing said first voltage on each of said row conductor lines in sequence to a first level during a respective first period of time to cause said first portions of said substrate associated with said respective row line to be reduced in absolute potential to a third value less than said second value whereby charge stored in said first portions transfers into respective second portions of said substrate associated with said respective row line,
    second means for reducing said second voltage on each of said column conductor lines to a second level in sequence to cause said second portions of said substrate to be reduced in absolute potential to a fourth value less than said third value whereby charge stored in each of said second portions transfers into said first portions,
    means for sensing in sequence each of the signals induced on said respective row line in response to the transfer of charge from the second portions to the first portions of said substrate associated with said respective row line.

2. The combination of claim 1 in which said second level of voltage is a value which is insufficient to support storage of charge in said second portions.

3. The combination of claim 2 including third means for collapsing said first voltage on said respective row line after sensing signals thereon during said first period to cause sensed charge in said first portions of the substrate associated with said respective row line to be injected into said substrate.

4. The combination of claim 1 in which said second means reduces on each of said column lines in sequence said second voltage to a second level during a respective second period of time shorter than said first period of time and therafter reestablishes said second voltage thereby to cause said second portions of said substrate to be reduced in absolute potential to a fourth value less than said third value and thereafter returned to said second value whereby charge stored in each of said second portions transfers into a respective first portion and back again to said second portion.

5. The combination of claim 4 including means for collapsing said first voltage on each of said row lines for an interval at the end of a respective first period and for simultaneously collapsing the second voltage on all of the column lines during said interval to cause charge in said first portions of the substrate associated with said respective row line to be injected into said substrate.

6. The combination of claim 1 including means for reestablishing said first voltage on said respective row line after sensing signals thereon to store again said sensed charges in the first portions of said substrate associated with said respective row line.

7. The combination of claim 1 including means for floating said row lines after said first voltage is provided thereon and means for floating said column lines after said second voltage is provided thereon.

8. The combination of claim 1 in which said first voltage and said second voltage are approximately in the ratio of two to one.

9. The combination of claim 1 in which
    said means for sensing said signals includes means for maintaining said respective row line fixed at said first level of said first voltage during each transfer of charge from the second portions to the first portions of said substrate associated with said respective row line and sensing the total charge flow during each such transfer to derive each of said signals.

10. The combination of claim 1 in which said means for storing charge includes means for exposing said substrate to a pattern of radiation.

11. The combination of claim 1 including refresh means for resetting said second voltage on each of said column lines to a respective voltage level corresponding to the initial charge storage voltage of the second portions associated with said selected row, said resetting occurring after said second voltage has been reduced to said second level thereon to cause transfer of charge from the second portions to the first portions of said substrate associated with a selected row line,
    said refresh means including means for sensing each of the packets of charge stored in the first portions associated with said selected row line and developing a respective signal voltage proportional thereto,
    means for deriving said second resetting voltage from said respective signal voltage by reducing the magnitude of said respective signal voltage by a factor corresponding to extraneously generated charge included in the packet,
    whereby when said selected row line is lowered in potential, charge is transferred from the first portions to the second portions associated with the selected row line and extraneously generated charge is injected into the substrate.

12. The combination of claim 1 including means for providing charge in said first portions of said substrate, means for setting said second voltage on each of said column conductor lines in sequence to successive levels corresponding to successive samples of an analog signal, means for reducing said first voltage on a selected row conductor line to at least threshold voltage for each of said conductor-insulator-semiconductor capacitors connected thereto to cause charge in said first portions to flow into said second portions associated with said selected row conductor line, to fill the potential well storage sites thereof, and to spill excess charge into said substrate, whereby packets of charge are now stored in said first portions corresponding to respective samples of said analog signal, means for re-establishing said first voltage on said selected row line to cause the packets of charge in each of said second portions to flow into said first portions and become stored therein.

13. The combination of claim 12 in which charge is provided in said first portions by radiative means.

14. In combination, a substrate of semiconductor material of one type conductivity having a major surface, first means forming a first plurality of charge storage sites for opposite type carriers adjacent said major surface of said substrate, second means forming a second plurality of charge storage sites for opposite carriers adjacent said major surface of said substrate, each coupled to a respective charge storage site of said first plurality to form a plurality of coupled pairs of charge storage sites, said coupled pairs of charge storage sites being arranged in an array of rows and columns, a plurality of row conductor lines and a plurality of column conductor lines, said first means including a first plurality of electrodes each insulatingly overlying a respective one of said storage sites of said first plurality, each of the electrodes of said first plurality in a respective row of sites being connected to a respective row line, said second means including a second plurality of electrodes, each insulatingly overlying a respective one said storage sites of said second plurality, each of the electrodes of said second plurality in a respective column of sites being connected to a respective column line, means for storing charge in said storage sites of said substrate, means for transferring in sequence charge from each of the column line coupled storage sites of a selected row of storage sites to a respective row line coupled storage site of said selected row by reducing the voltage on each of said column lines, means for sensing in sequence the signals induced on said one row line coupled to said selected row of storage sites during the lowering of said voltages on said column lines in sequence.

* * * * *